(12) United States Patent
Dubois et al.

(10) Patent No.: US 11,562,843 B2
(45) Date of Patent: Jan. 24, 2023

(54) INDUCTIVE FILTERING DEVICE WITH TORIC MAGNETIC CORE

(71) Applicant: THALES, Courbevoie (FR)

(72) Inventors: Eric Dubois, Chatou (FR); Hocine Kherbouchi, Chatou (FR); Didier Lalevee, Chatou (FR)

(73) Assignee: THALES, Courbevoie (FR)

( * ) Notice: Subject to any disclaimer, the term of this patent is extended or adjusted under 35 U.S.C. 154(b) by 972 days.

(21) Appl. No.: 16/233,778

(22) Filed: Dec. 27, 2018

(65) Prior Publication Data
US 2019/0206606 A1 Jul. 4, 2019

(30) Foreign Application Priority Data
Dec. 28, 2017 (FR) ...................................... 1701401

(51) Int. Cl.
| | |
|---|---|
| H01F 27/24 | (2006.01) |
| H01F 17/06 | (2006.01) |
| H03H 7/09 | (2006.01) |
| H01F 27/28 | (2006.01) |
| H03H 1/00 | (2006.01) |
| H01F 3/14 | (2006.01) |
| H01F 37/00 | (2006.01) |
| H01F 17/04 | (2006.01) |
| H01F 3/10 | (2006.01) |
| H01F 27/255 | (2006.01) |
| H01F 27/25 | (2006.01) |

(52) U.S. Cl.
CPC .............. *H01F 27/24* (2013.01); *H01F 3/10* (2013.01); *H01F 3/14* (2013.01); *H01F 17/045* (2013.01); *H01F 17/062* (2013.01); *H01F 27/28* (2013.01); *H01F 27/2895* (2013.01); *H01F 37/00* (2013.01); *H03H 1/00* (2013.01); *H03H 7/09* (2013.01); *H01F 27/25* (2013.01); *H01F 27/255* (2013.01); *H01F 2003/106* (2013.01); *H03H 2001/005* (2013.01); *H03H 2001/0035* (2013.01); *H03H 2001/0092* (2013.01)

(58) Field of Classification Search
CPC .. H01F 16/062; H01F 17/0033; H01F 17/062; H01F 27/24; H03H 1/0007
USPC .......................................... 333/185; 336/221
See application file for complete search history.

(56) References Cited

U.S. PATENT DOCUMENTS

| | | | |
|---|---|---|---|
| 4,715,043 A | 12/1987 | Chikasue | |
| 5,329,269 A * | 7/1994 | Watson | G01R 33/045 336/213 |
| 2011/0301897 A1* | 12/2011 | Weiss | G01C 25/00 324/202 |
| 2013/0002384 A1 | 1/2013 | Tokota et al. | |
| 2015/0222170 A1* | 8/2015 | Berger | H02J 3/381 363/40 |

FOREIGN PATENT DOCUMENTS

CN 104347257 A 2/2015

* cited by examiner

*Primary Examiner* — Rakesh B Patel
(74) *Attorney, Agent, or Firm* — BakerHostetler

(57) ABSTRACT

An inductive filtering device includes a first toric magnetic core without an air gap formed around a central void; a first electrical conductor formed of turns that are wound around the first magnetic core without passing through the central void, wherein no electrical conductor passes through the central void.

15 Claims, 6 Drawing Sheets

INDUCTIVE FILTERING DEVICE WITH TORIC MAGNETIC CORE

CROSS-REFERENCE TO RELATED APPLICATIONS

This application claims priority to foreign French patent application No. FR 1701401, filed on Dec. 28, 2017, the disclosure of which is incorporated by reference in its entirety.

FIELD OF THE INVENTION

The invention relates to an inductive filtering device. This type of filtering is commonly used to decrease potential interference present on an electrical conductor. The device is then positioned in series on the line.

BACKGROUND

Filtering devices may be implemented for an isolated electrical conductor or for coupled conductors. For coupled conductors, common-mode interference or differential interference may occur and known assemblies of inductive filters allow these two types of interference to be attenuated.

Inductive filtering devices are generally produced by means of wound electrical conductors. To increase the inductance value of the device, the winding may be wound around a magnetic core, for example made of soft ferromagnetic material, i.e. having low coercivity, typically lower than 1000 $A.m^{-1}$, so as to limit magnetic losses during the use thereof.

Among the known ferromagnetic materials, it is common to use materials that are formed of alloys containing mainly iron and nickel. These materials appeared at the beginning of the $20^{th}$ century and are known in particular by the names of permalloy and mu-metal. These materials are crystalline and to obtain good magnetic properties, heat treatment is required, which treatment tends to increase the dimensions of the crystal grains. This increase in grain size tends to have a negative effect on the mechanical properties of these alloys, making them difficult to shape.

Amorphous materials were subsequently developed in order to facilitate the use of ferromagnetic materials. However, the presence of amorphizing elements, such as boron for example, tends to limit saturation induction. Moreover, substantial magnetic losses occur during use at high frequency.

Toward the end of the $20^{th}$ century, a new family of nanocrystalline materials was developed, in particular by ArcelorMittal Imphy and known by the name of Finemet. Different variants are produced under the name of Nanophy. They have FeCuMSiB-type compositions, where M is a transition metal. A widely used composition is of the type: $Fe_{73.5}Cu_1Nb_3Si_xB_{22.5-x}$, and they have a silicon content of 13.5% or 16.5%.

In this family, iron-silicon crystals are embedded in a residual amorphous matrix. The dimensions of the crystals are of the order of nanometers. In comparison with iron-nickel alloys, nanocrystalline materials have the advantage of exhibiting a much higher saturation induction, of the order of 1.3 T instead of the 0.7 T typical for Permalloy.

More recently, other, FeMB nanocrystalline materials have also been developed. They generally contain more than 80% iron, 7% transition metal and the rest made up of boron. The materials in this family comprise pure iron nanocrystals. Their saturation induction is comparable to that of the Finemet family.

Nanocrystalline materials make it possible to benefit from certain advantages of amorphous materials, in particular their homogeneity. This is because, for nanocrystalline materials, the structure is composed of very small crystals that are oriented randomly and distributed homogeneously throughout an amorphous matrix and hence there are no grain boundaries.

Nanocrystalline materials are often produced in the form of ribbons that are wound to form tori. It is then possible to use these tori to produce inductors or transformers. The windings are wound by passing through the void located in the center of the torus, which is not easy to achieve. This void will be referred to hereinafter as the central void.

It is also common practice to wind the windings outside their magnetic circuit, or around an open magnetic circuit, which is much easier to achieve. After assembling the magnetic circuit and the winding, if the latter is produced separately, it is possible to close the magnetic circuit. However, nanocrystalline materials are difficult to machine and are therefore unsuitable for the production of an open magnetic circuit.

SUMMARY OF THE INVENTION

The invention aims to allow greater flexibility in the implementation of magnetic cores formed in the shape of tori. In the invention it is in particular possible to use coils wound outside a magnetic circuit with a toric magnetic core without an air gap.

To this end, the subject of the invention is a filtering device comprising:
  a first cylindrically shaped toric magnetic core without an air gap being wound around an axis of the first core and formed around a central void also lying along the axis of the first core;
  a first electrical conductor formed of turns that are wound around the first magnetic core without passing through the central void, the first electrical conductor being wound around the first magnetic core along a winding axis that is substantially perpendicular to the axis of the first core,
wherein no electrical conductor passes through the central void.

Alternatively, the first electrical conductor may be wound around the first magnetic core along a winding axis that is substantially coincident with the axis of the first core.

The term "toric magnetic core" will be understood hereinafter to mean any shape of magnetic circuit that is closed around a void referred to as the central void. Any shape of closed magnetic circuit without an air gap is considered to be toric and may be used within the scope of the invention. The shape of the magnetic circuit around its central void may also be curved, polygonal or any combination of shapes. The general shape of the magnetic circuit around its central void may be planar or even warped.

Advantageously, a characteristic dimension of a coil produced by winding the first electrical conductor is larger than a largest dimension of a cylindrical section of the central void, the characteristic dimension and the largest dimension of the cylindrical section extending in one and the same direction.

Preferably, the characteristic dimension of the coil is substantially equal to an outer largest dimension of the magnetic core extending in the direction.

Advantageously, the device further comprises a second toric magnetic core formed around a second central void, the first magnetic core being arranged inside the second central void such that the second toric magnetic core encloses a magnetic circuit formed by the first magnetic core. The first electrical conductor may be wound around the first magnetic core along a winding axis that is substantially perpendicular to the axis of the first core or substantially coincident with the axis of the first core.

An air gap may be present between the first magnetic core and the second magnetic core. The device then advantageously comprises at least one magnetic or non-magnetic shim arranged in the air gap.

Advantageously, the device further comprises a second electrical conductor formed of turns that are wound around the second magnetic core.

Advantageously, no electrical conductor passes through the second central void, the turns of the second electrical conductor being wound around the second magnetic core without passing through the second central void.

The first toric magnetic core is wound around a first axis. The first electrical conductor is wound around the first winding axis. The second toric magnetic core is wound around a second winding axis. The first and second winding axes are advantageously substantially perpendicular or parallel.

The first magnetic core and/or, if present, the second magnetic core are/is advantageously made of ferromagnetic material.

The first magnetic core and/or, if present, the second magnetic core are/is advantageously made of nanocrystalline material.

The central void of the first magnetic core is advantageously filled with a ferromagnetic material.

The device may comprise a plurality of first toric magnetic cores that are formed around a central void, and a plurality of first electrical conductors that are each formed of turns that are wound around one of the first magnetic cores without passing through the central void of the first magnetic core around which the first electrical conductor in question is wound. The first magnetic cores are arranged inside the central void of the second magnetic core.

The device according to the claim may further comprise a third toric magnetic core arranged inside the second central void, the first magnetic cores being arranged between the second magnetic core and the third magnetic core.

The first magnetic core may be produced in the form of a stack of a plurality of elementary magnetic cores around which the first electrical conductor is wound.

BRIEF DESCRIPTION OF THE DRAWINGS

The invention will be better understood and further advantages will become apparent upon reading the detailed description of an embodiment given by way of example, which description is illustrated by the attached drawing, in which.

For the sake of clarity, the same elements will bear the same references in the various figures.

DETAILED DESCRIPTION

Figure 1:
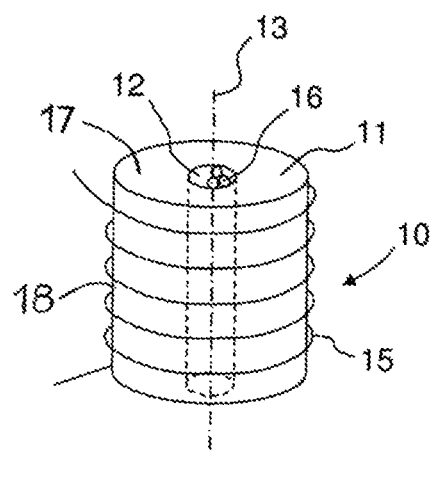
FIGS. 1 and 2 show two embodiments of coils that are wound around a toric magnetic core and in accordance with the invention.

FIG. 1 shows a first embodiment of a filtering device 10 comprising a toric magnetic core 11 without an air gap that is formed around a central void 12. The magnetic core 11 is cylindrical in shape and extends about an axis 13. The central void 12 also extends along the axis 13.

The filtering device 10 comprises an electrical conductor 15 formed of turns that are wound around the magnetic core 11. The electrical conductor 15 may have a flat cross section, for example in the shape of a foil or of a braid that is wound around the magnetic core 11 by stacking the turns on top of one another. Alternatively, the electrical conductor 15 may have a circular cross section. The turns may be arranged side by side in one or more layers. The electrical conductor 15 may be made of various metal alloys, such as copper or aluminum alloys.

The presence of a central void 12 allows the production of the magnetic core to be facilitated, in particular when it is made of nanocrystalline material, because of the formation of this material as a ribbon wound around the central void 12. Conventionally, in the presence of a central void 12, the turns of a filtering device are formed by passing through the central void 12. This allows the magnetic circuit to be closed. Conversely and unconventionally, the invention proposes winding the turns of the electrical conductor 15 around the magnetic core 11 without passing through the central void 12. Taken alone, the filtering device 10 comprises an open magnetic circuit, which, a priori, does not perform as well as a closed magnetic circuit. However, this allows the turns of the electrical conductor 15 to be wound much more easily without passing through a central void. In the variant of FIG. 1, the turns of the electrical connector 15 are wound around the axis 13.

The invention is highly suitable for a magnetic core 11 made of nanocrystalline ferromagnetic material. It is also possible to produce the magnetic core 11 in other types of ferromagnetic materials. It is possible to fill the central void 12 with a ferromagnetic material in order to take advantage of the free space left in the central void so as to further increase the inductance value of the electrical conductor 15. The filler material may be of a different type than that used for the magnetic core 11. In FIG. 1, the central void 12 is filled by means of balls 16 made of ferromagnetic material. Other forms may be used to fill the central void 12.

Figure 2:
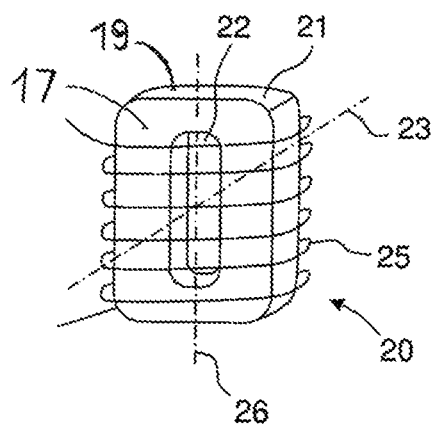

FIG. 2 shows a second embodiment of the filtering device 20 comprising a toric magnetic core 21 without an air gap that is formed around a central void 22. The magnetic core 21 is also in the shape of a cylinder extending about an axis 23. The central void 22 extends along the axis 23. The concept of cylindrical shape should be understood in the broad sense, i.e. a shape derived from any curve and from a generatrix based on the curve. To obtain the central void 22, the curve is closed. The presence of a closed curve facilitates the production of the magnetic core from ribbons wound around the shape of the closed curve. In the example of FIG. 2, the curve is substantially rectilinear and the generatrix of the cylindrical shape is a direction extending along the axis 23. Any other curved shape is of course possible within the scope of the invention.

The filtering device 20 comprises an electrical conductor 25 formed of turns that are wound around the magnetic core 21. Unlike the filtering device 10, in which the conductor 15 is wound around the axis 13 along which the central void 12 extends, the electrical conductor 25 is wound around the magnetic core 21 along an axis 26 that is substantially perpendicular to the axis 23. In the example shown, in which the closed curve is substantially rectangular, the axis 26 is parallel to the longest length of the rectangle. Alternatively, it is possible the wind the turns of the conductor 25 around an axis that is parallel to the shortest length of the rectangle. However, a winding axis for the turns that is parallel to the longest length of the rectangle makes it possible, for one and the same number of turns, to wind them closer to the magnetic circuit and thus to increase the inductance value of the filtering device 20.

Like for the device 10, it is possible to fill the central void 22 with a ferromagnetic material.

Like for the embodiment of FIG. 1, the magnetic core 21 may be made of nanocrystalline ferromagnetic material or in other types of ferromagnetic materials. The magnetic cores 11 and 21 may be produced without air gaps, which is highly suitable for nanocrystalline ferromagnetic materials, or by means of cores that are broken and joined, which is suitable for other types of ferromagnetic materials. The choice may be made according to the availability of broken or unbroken magnetic cores on the market.

The filtering devices 10 and 20 shown in FIGS. 1 and 2 each comprise a single winding that is formed by the conductors 15 and 25, respectively. Alternatively, still within the scope of the invention, a plurality of windings may be wound around one and the same magnetic core in order to couple these windings.

Internal tests have shown that the filtering device 10 allows a higher inductance value to be obtained compared with the filtering device 20. One possible explanation for this result is that, inside the coil of the filtering device 10, the magnetic field lines follow the material of the magnetic core 11 in a continuous manner. The field lines are substantially rectilinear inside the magnetic core 11. However, in the filtering device 20, some of these field lines are broken by passing through the central void or exhibit non-rectilinear directions through the magnetic core 21. In other words, the magnetic field lines are channeled better through the magnetic core 11 than through the magnetic core 21, hence the possibility of obtaining a higher inductance value for the filtering device 10.

The filtering device 20 does however have an advantage in terms of heat dissipation, in particular when the magnetic core is made of nanocrystalline material, because of its formation as a ribbon wound around the axis 23 of the central void. Specifically, the faces of the magnetic core perpendicular to this winding axis have a surface state that is much less planar than that of the other faces. More specifically, the magnetic core 11 comprises two planar faces 17 that are perpendicular to the axis 13 and one cylindrical face 18 extending about the axis 13. When producing the magnetic core 11, the cylindrical face 18 has a smooth surface while the planar faces 17 are striated because of the stacking of the layers of ribbon. For removing the heat generated in the filtering device 10 due to magnetic losses, it is possible to position a radiator only on one of the planar faces 17 (or possibly on both planar faces 17) since the face 18 is occupied by the electrical conductor 15. The surface state of the planar faces 17 results in uneven contact between the radiator and the planar face 17 in question, which is not favorable for heat exchange between the planar faces 17 and the radiator.

In the filtering device 20, the magnetic core 21 has two striated faces also bearing the reference 17 and two planar faces 19 that are not masked by the conductor 25. The planar faces 19 are not perpendicular to the axis 23 around which the ribbon of nanocrystalline material is wound. The planar faces 19 therefore have a surface state that is comparable to that of the cylindrical surface 18, i.e. smooth, which is conducive to better contact with a radiator.

Figure 3:
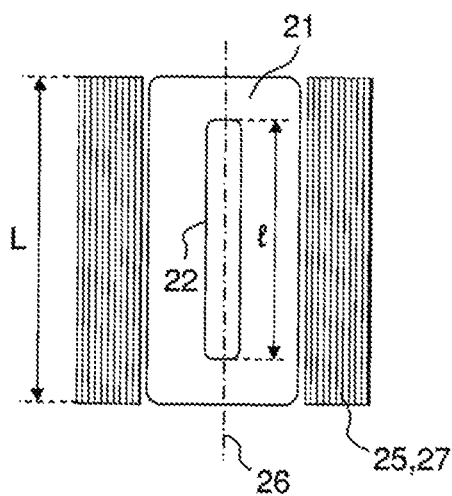
FIGS. 3 and 4 show two variants of the embodiment of FIG. 2.

FIG. 3 shows, in cross section, one variant of the device 20 in which the conductor 25 is produced by means of a foil 27 that is wound around the magnetic core 21. The longest length, denoted by I, of the cylindrical section of the central void 22 extends along the axis 26. By winding the foil 27 around the magnetic core 21 without passing through the central void 22, a foil 27 whose width, denoted by L, is larger than the length I of the central void 22 may be chosen. This allows better use to be made of the outer length of the magnetic core 21 along the axis 26. In the example shown, the width of the foil 27 is equal to the outer length of the magnetic core 21. The inductance value obtained by the winding of the foil 27 is increased thereby.

Figure 4:
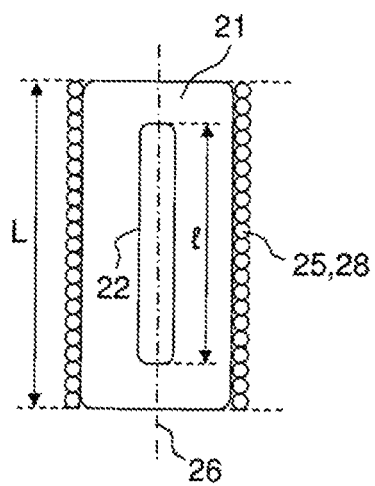

FIG. 4 shows, in cross section, another variant of the device 20 in which the conductor 25 is produced by means of an electrical conductor 25 of circular cross section and bearing the reference 28. The length of the coil produced by winding the conductor 28 is defined along the axis 26. In the example shown, the length of the coil is equal to the outer length of the magnetic core 21. The length of the coil is therefore also denoted by L in FIG. 4 and is also longer than the length I of the central void 22. The inductance value obtained by the winding of the conductor 28 is also increased thereby. In FIG. 4, the conductor 28 forms a single layer of turns. The coil thus formed may of course comprise a plurality of layers of turns.

More generally, a characteristic dimension L of the coil produced by winding the electrical conductor 25 is larger than the largest dimension I of the cylindrical section of the central void 22, the two dimensions extending in the same direction, in this instance the axis 26. This characteristic has also been verified for the embodiment shown in FIG. 1. Preferably, the characteristic dimension L of the coil is substantially equal to the largest outer dimension of the magnetic core, still measured along the axis 26, so that the magnetic flux present inside the coil is guided as much as possible by the magnetic core.

Figure 5A:
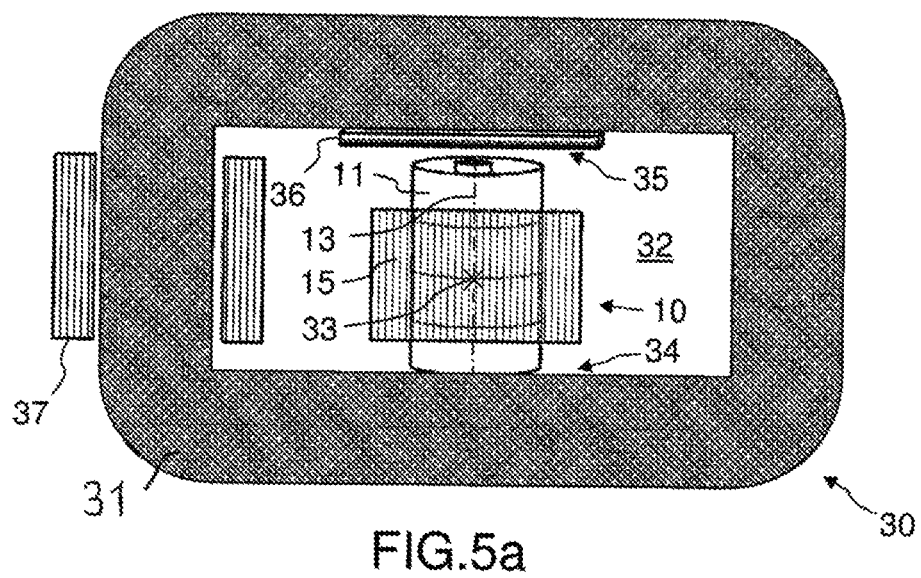
FIGS. 5a, 5b, 6a and 6b show, respectively, the use of the coils of FIGS. 1 and 2 in more complex filtering devices.
Figure 5B:
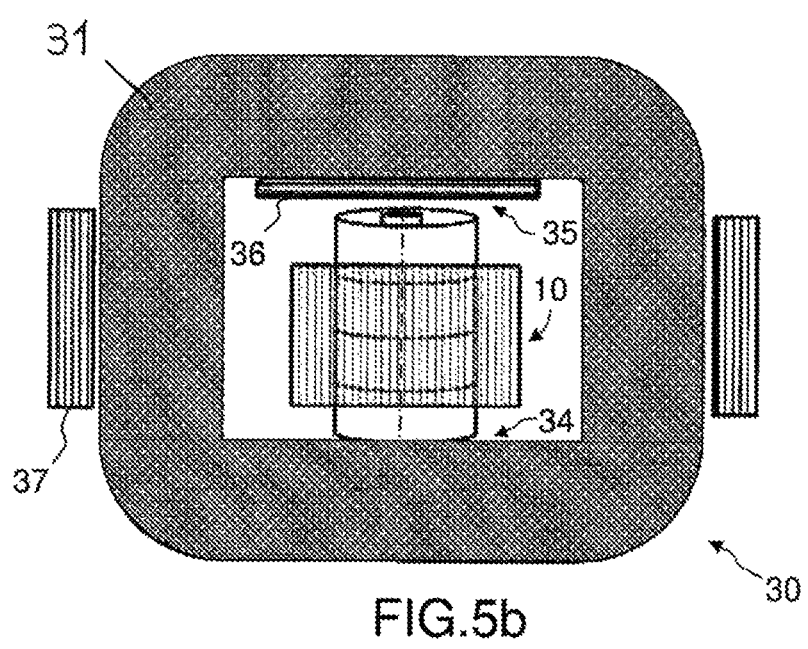

FIGS. 5a and 5b show the use of the device 10 of FIG. 1 in a more complex filtering device 30. The filtering device 30 comprises a toric magnetic core 31 without an air gap that is formed around a central void 32. The first device 10 is arranged inside the central void 32 such that the magnetic core 31 encloses a magnetic circuit that is formed by the magnetic core 11.

The magnetic core 31 may be made of ferromagnetic material and in particular nanocrystalline ferromagnetic material in order to concentrate therein the magnetic field lines formed in the magnetic core 11 as a current flows through the conductor 15.

The magnetic core 31 is also in the shape of a cylinder extending about an axis 33 that is perpendicular to the plane of FIG. 3. The cylindrical shape is based on a substantially rectangular closed curve. The axis 13 around which the turns of the electrical conductor 15 are wound is substantially perpendicular to the axis 33.

The magnetic core 11 may make contact with the magnetic core 31 on two opposite sides of the substantially rectangular curve. Air gaps 34 and 35 are formed at each of the contacts between the two magnetic cores 11 and 31. It is possible to arrange a shim 36, which may be magnetic or non-magnetic, in one or possibly both of the air gaps. A magnetic shim 36 allows the functional clearance between the two magnetic cores 11 and 31 to be filled while better channeling the magnetic flux generated by the turns of the conductor 25. Conversely, a non-magnetic shim 36 allows a non-magnetic air gap to remain and thus the value of the saturation current to be controlled and the variation in the value of the inductance to be limited. More specifically, as long as the magnetic core 11 is not saturated, the inductance value remains constant. If the intensity of the current flowing through the electrical conductor 15 increases such that the magnetic core 11 is saturated, the inductance value decreases. The insertion of a non-magnetic shim 36 allows the intensity of the current to be increased beyond that at which saturation is reached.

It is possible to supplement the device 30 with another electrical conductor 37 formed of turns that are wound around the magnetic core 31. In FIG. 5a, the turns of the electrical conductor 37 may, this time, be wound in the conventional manner by passing through the central void 32 of the magnetic core 31. Here, one or more other windings may be formed around the magnetic core 31. Alternatively or additionally, as shown in FIG. 5b, the electrical conductor 37 may be wound around the magnetic core 31 in an unconventional manner, i.e. without passing through the central void 32.

Figure 6A:
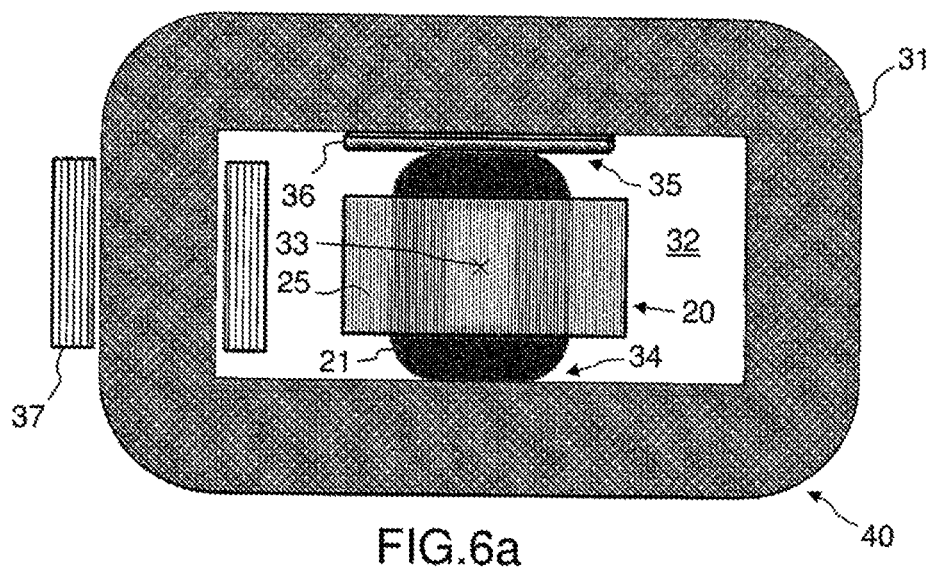
Figure 6B:
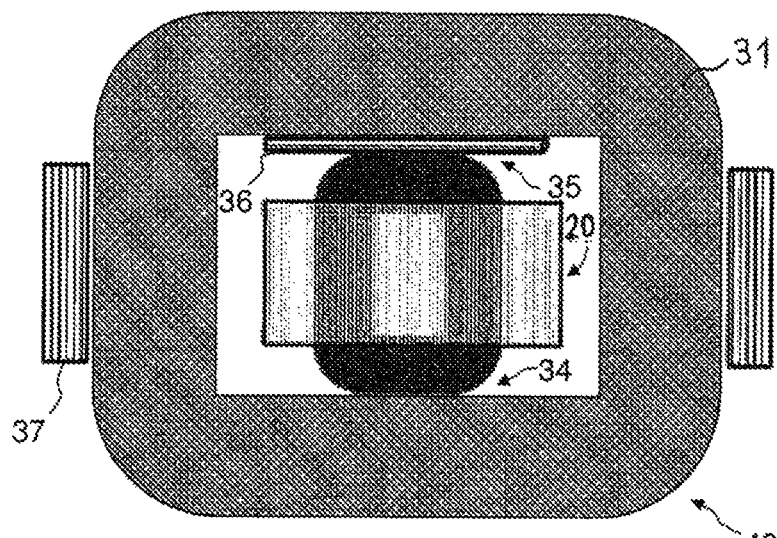

FIGS. 6a and 6b show the use of the device 20 of FIG. 2 in a filtering device 40 that is akin to the filtering device 30. The filtering device 40 comprises the magnetic core 31 and optionally the electrical conductor 37 wound in a conventional manner, as shown in FIG. 6a. As above, alternatively or additionally, as shown in FIG. 6b, the electrical conductor 37 may be wound around the magnetic core 31 in an unconventional manner. The axis 26 around which the turns of the electrical conductor 25 are wound is substantially perpendicular to the axis 33. One or more shims 36 may be arranged in one or both air gaps 34 and 35.

Like for the magnetic cores 11 and 21, the magnetic core 31 may be produced without an air gap, i.e. unbroken. Alternatively, it is possible to produce the magnetic core 31 from broken cores, which is advantageous in the case that the electrical conductor 37 is wound conventionally. The magnetic core 31 is then joined together after the coil of the conductor 27 has been inserted through the broken portions.

In the devices shown in FIGS. 5b and 6b, no electrical conductor passes through the central void 32. Winding the electrical conductor 37 unconventionally allows its characteristic dimension to be increased, as described with the aid of FIGS. 3 and 4.

With or without an electrical conductor 37, the magnetic core 31 present in the filtering devices 30 and 40 forms a radiator allowing the heat generated by the magnetic losses from the devices 10 and 20 to be removed. As mentioned above, the heat exchange between the device 20 and the magnetic core 31 in the variants of FIGS. 6a and 6b takes place more efficiently than the heat exchange in the filtering device 30 of FIGS. 5a and 5b between the device 10 and the magnetic core 31.

Conversely, the inductance value of the filtering device is higher in the variants of FIGS. 5a and 5b than in the variants of FIGS. 6a and 6b.

Figure 7:
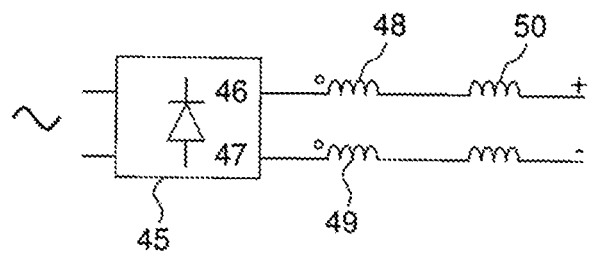
FIG. 7 shows an exemplary use of one of the filtering devices of FIG. 3 or 4.

FIG. 7 shows an exemplary use of one of the filtering devices 10 or 20. These devices may be used for common-mode and differential filtering at the output of a converter 45 delivering a DC voltage between two outputs 46 and 47. The common-mode filtering may be performed by means of two windings 48 and 49 that are each connected in series with one of the two outputs 46 and 47. The two windings 48 and 49 are wound in the same direction, for example conventionally, and/or unconventionally, around the magnetic core 31 like the electrical conductor 37. The differential filtering may be performed by means of a winding 50 that is connected in series to one of the outputs, for example the output 46. The winding 50 may be formed by the electrical conductor 15 that is wound around the magnetic core 11. Other components, such as capacitors, may be added to the filtering example described with the aid of FIG. 7. Numerous other types of winding connections are of course possible for providing filtering at the output of a converter.

Figure 8:
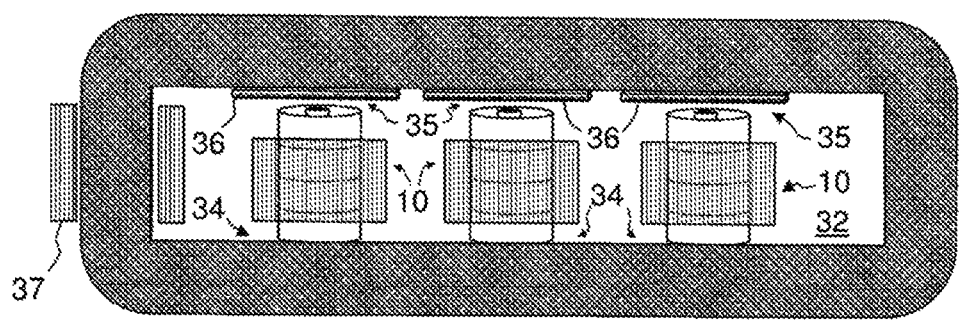
FIG. 8 shows one variant of the device of FIG. 3.

FIG. 8 shows one variant of the device of FIG. 3 comprising a plurality of devices 10 that are arranged inside the central void 32 of the magnetic core 31 in order to form a filtering device 55. The various devices 10 are all arranged between two opposite faces of the central void 32. A shim 36 may be arranged between each of the magnetic circuits 11 and the magnetic circuit 31. A plurality of devices 20 or of other, analogous devices may be used instead of the various devices 10. The filtering device 55 may also comprise a conductor 37 that is wound around the magnetic core 31 conventionally or unconventionally.

Figure 9:
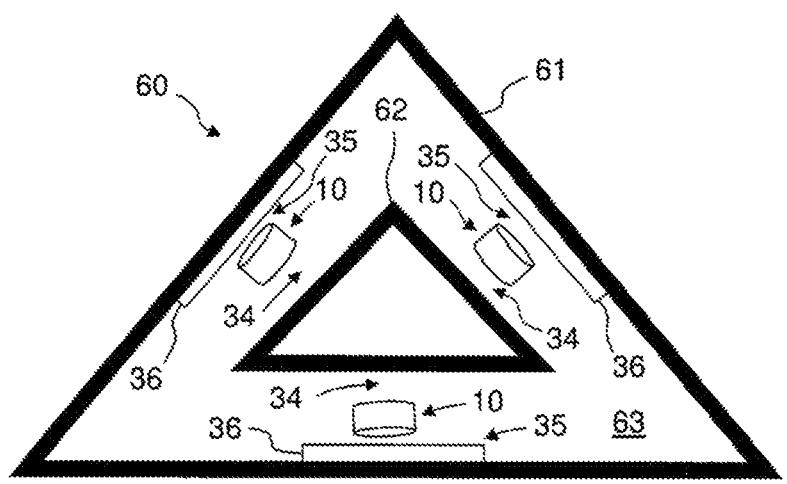
FIG. 9 shows another variant of a device according to the invention.

FIG. 9 shows another variant of a filtering device 60 in accordance with the invention and comprising a plurality of devices 10; three thereof in the example shown. The magnetic core 31 is here replaced with two toric magnetic cores 61 and 62 without air gaps that are each formed around a central void 63 and 64, respectively. The two magnetic core 61 and 62 are nested. More specifically, the central void 63 of the magnetic core 61 is configured to contain the magnetic core 62. The devices 10 are arranged inside the central void 63 between the two magnetic cores 61 and 62. In the example shown, the two magnetic cores 61 and 62 are both in the shape of a cylinder derived from a triangular curve shown in the plane of FIG. 9 and from a generatrix that is perpendicular to the plane of FIG. 9. The triangular curves are equilateral and the sides of the triangles of each of the magnetic cores 61 and 62 face one another. A device 10 is arranged between the parallel faces of each of the two triangles. Each of the magnetic circuits 11 of the devices 10 is closed partly by the magnetic core 61 and partly by the magnetic core 62. As above, the magnetic cores 61 and 62 may be made of ferromagnetic material and in particular nanocrystalline ferromagnetic material. A shim 36 may be arranged between each of the magnetic circuits 11 and one of the magnetic circuits 61 and 62. As above, filtering devices 20 may replace the filtering devices 10.

It is of course possible to arrange more than one device 10 between two parallel faces of each of the triangles. A triangular arrangement is for example suitable for filtering a three-phase network. Other shapes of magnetic cores are also envisageable within the scope of the invention. Windings that are akin to the winding 37 may be wound around one or both of the magnetic cores 61 and 62 conventionally or unconventionally.

FIGS. 1 to 4 show embodiments of coils that are wound around a single magnetic circuit. Within the scope of the invention, it is possible to stack a plurality of magnetic cores 11 or 21 and to form the same winding around this stack. FIGS. 10 to 13 show several variants of stacks of magnetic cores around which one or more electrical conductors are wound to produce elementary filtering devices having functions similar to those described in FIGS. 1 to 4. Around the stacks of FIGS. 10 to 13, it is possible to wind any form of electrical conductor, such as for example longilineal electrical conductors, for example with round or square cross sections. It is also possible to wind foils as described with the aid of FIG. 3.

Figure 10:
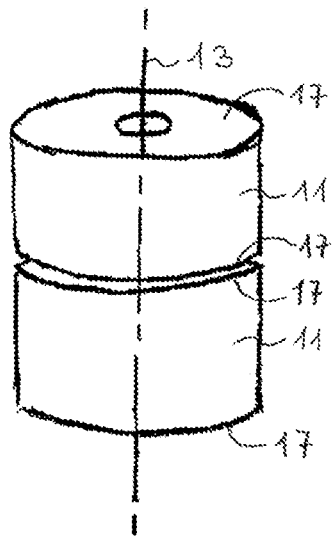
FIGS. 10 to 16 show several variants of stacks of magnetic cores that may be used to produce filtering devices in accordance with the invention.
Figure 11:
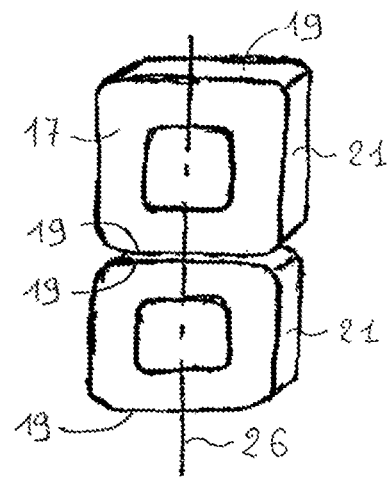
Figure 12:
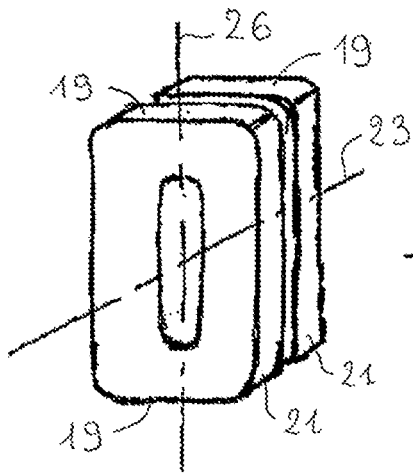
Figure 13:
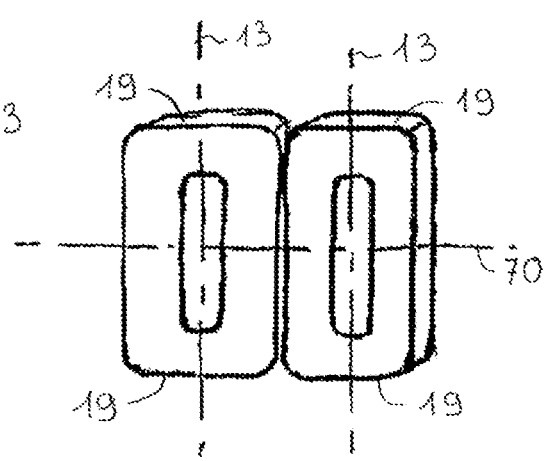

FIG. 10 shows two magnetic cores 11 that are stacked along their axis 13. FIG. 11 shows two magnetic cores 21 that are stacked along their axis 26. FIG. 12 shows two magnetic cores 21 that are stacked along their axis 23. FIG. 13 shows two magnetic cores 21 that are stacked along an axis 70 that is perpendicular to the axes 23 and 26. FIGS. 10 to 13 show stacks of two elementary magnetic cores. It is of course possible to stack more than two magnetic cores. It is even possible to stack elementary magnetic cores along a plurality of distinct axes, for example simultaneously along a plurality of axes from among the axes 23, 26 and 70.

As mentioned above, in the stack of FIG. 10, the two magnetic cores make contact via their face 17 which, in the case of an embodiment using wound nanocrystalline material, does not exhibit a good surface state. Conversely, in the stack of FIG. 11, the magnetic cores 21 make contact via their face 19, which is favorable for good heat exchange. In the stacks of FIGS. 12 and 13, the faces 19 of the two magnetic cores 21 remain free for contact with a radiator if the electrical conductor is wound around the axis 13.

In FIGS. 10 to 13, the axes of the various stacked cores are all coincident or parallel with one another. Alternatively, as shown in FIGS. 14 and 15, the axes of the various cores may be perpendicular to one another.

Figure 14:
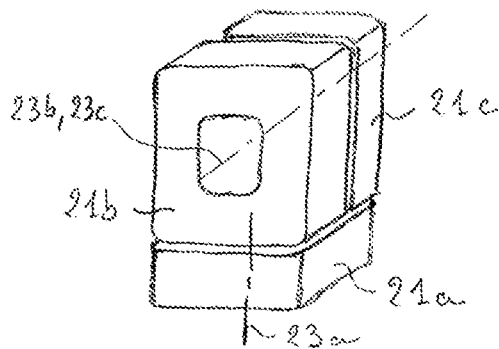

In FIG. 14, three cores 21 are stacked. To distinguish between them, they bear the references 21a, 21b and 21c. The axis 23a of the core 21a is vertical and the axes 23b and 23c of the cores 21b and 21c, respectively, are horizontal and coincident. The two cores 21b and 21c are placed on top of the core 21a and mask its central void.

Figure 15:
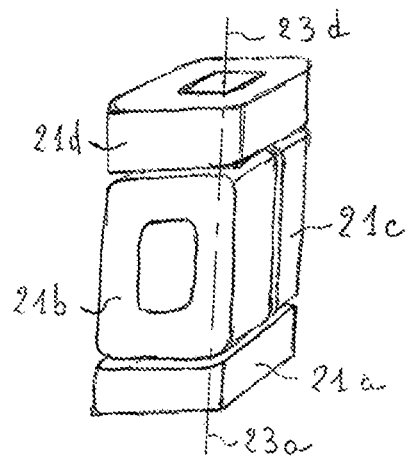

In FIG. 15, the three cores 21a, 21b and 21c are present, along with a fourth core 21d whose axis 23d is coincident with the axis 23a of the first core 21a. The core 21d is arranged on top of the two cores 21b and 21c.

Figure 16:
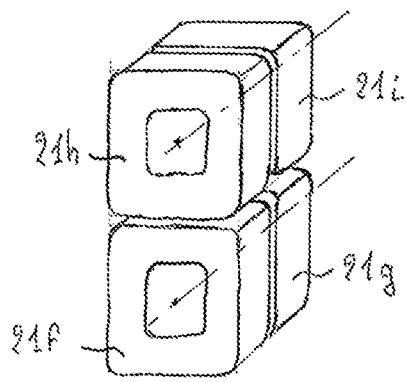

In FIG. 16, four cores 21f, 21g, 21h and 21i are stacked. The axes of these four cores are parallel.

The examples given in FIGS. 14, 15 and 16 are not limiting. Any other stack of cores, regardless of the orientation of their axes, is of course possible. The advantage of this type of stack lies mainly in the adaption of the electromagnetic performance to the available volume. Specifically, it was seen above that the filtering device 10 allows a higher inductance value to be obtained compared with the filtering device 20. Consequently, when, in one and the same volume, cores may be stacked preferentially such that most of the cores have their axes parallel to the winding axis of the turns, it will be possible to obtain a higher inductance value than when, in one and the same volume, most of the cores have axes that are perpendicular to the winding axis of the turns.

For example, assuming that the stacks of FIGS. 15 and 16 occupy the same volume and that the turns are wound around a vertical axis, a filtering device produced using the stack of FIG. 15 exhibits a higher inductance value than a filtering device produced using the stack of FIG. 16.

This adaption may use standard magnetic cores as the starting point. Starting with the same elementary cores, it is possible to vary the inductance value by modifying the orientation of the cores in the stack. For this, cores with a square cross section perpendicular to their axis and whose thickness along their axis is equal to half of the side of the square of the cross section are chosen. In other words, an elementary core substantially occupies the volume of half a cube. This allows the same volume to be obtained for the stacks of FIGS. 15 and 16.

Before winding the winding around the stack, it is possible to provide mechanical holding means allowing the various cores of the stack to be secured. It is in particular possible to provide banding around the stack. Alternatively, it is possible to immerse the stack in a resin.

The invention claimed is:

1. A filtering device comprising:
a first cylindrically shaped toric magnetic core without an air gap being wound around an axis of the first core and formed around a central void also lying along the axis of the first core;
a first electrical conductor formed of turns that are wound around the first magnetic core without passing through the central void, the first electrical conductor being wound around the first magnetic core along a winding axis that is substantially perpendicular to the axis of the first core,
wherein no electrical conductor passes through the central void, and
further comprising a second toric magnetic core formed around a second central void, the first magnetic core being arranged inside the second central void such that the second toric magnetic core encloses a magnetic circuit formed by the first magnetic core.

2. The device according to claim 1, wherein a characteristic dimension of a coil produced by winding the first electrical conductor is larger than a largest dimension of a cylindrical section of the central void, the characteristic dimension and the largest dimension of the cylindrical section extending in a same direction.

3. The device according to claim 2, wherein the characteristic dimension of the coil is substantially equal to an outer largest dimension of the magnetic core extending in the direction.

4. The device according to claim 1, wherein the first magnetic core is produced in the form of a stack of a plurality of elementary magnetic cores around which the first electrical conductor is wound.

5. The device according to claim 1, wherein an air gap is present between the first magnetic core and the second magnetic core, the device further comprising at least one magnetic or non-magnetic shim arranged in the air gap.

6. The device according to claim 1, further comprising a second electrical conductor formed of turns that are wound around the second magnetic core.

7. The device according to claim 6, wherein no electrical conductor passes through the second central void, the turns of the second electrical conductor being wound around the second magnetic core without passing through the second central void.

8. The device according to claim 1, wherein the second toric magnetic core is wound around a second winding axis and wherein the first and second winding axes are substantially parallel.

9. The device according to claim 1, wherein the first magnetic core is made of ferromagnetic material.

10. The device according to claim 1, wherein the first magnetic core is made of nanocrystalline ferromagnetic material.

11. The device according to claim 1, wherein the second magnetic core is made of ferromagnetic material.

12. The device according to claim 1, wherein the second magnetic core is made of nanocrystalline ferromagnetic material.

13. The device according to claim 1, wherein the central void of the first magnetic core is filled with a ferromagnetic material.

14. The device according to claim 1, comprising a plurality of first toric magnetic cores that are formed around a central void, and a plurality of first electrical conductors that are each formed of turns that are wound around one of the first magnetic cores without passing through the central void of the first magnetic core around which the first electrical conductor in question is wound, wherein the first magnetic cores are arranged inside the central void of the second magnetic core.

15. The device according to claim 14, further comprising a third toric magnetic core arranged inside the second central void, the first magnetic cores being arranged between the second magnetic core and the third magnetic core.

* * * * *